(12) United States Patent
Weltin-Wu et al.

(10) Patent No.: US 8,786,341 B1
(45) Date of Patent: Jul. 22, 2014

(54) FREQUENCY SYNTHESIZER WITH HIT-LESS TRANSITIONS BETWEEN FREQUENCY- AND PHASE-LOCKED MODES

(71) Applicant: Silicon Laboratories Inc., Austin, TX (US)

(72) Inventors: Colin Weltin-Wu, Mountain View, CA (US); Yunteng Huang, Palo Alto, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/833,360

(22) Filed: Mar. 15, 2013

(51) Int. Cl.
*H03L 7/06* (2006.01)
(52) U.S. Cl.
USPC .......................................... 327/159; 327/156

(58) Field of Classification Search
USPC ................... 327/156, 159, 160; 375/375–376
See application file for complete search history.

(56) References Cited

U.S. PATENT DOCUMENTS

| 7,750,701 B2 * | 7/2010 | Ainspan et al. ............... 327/159 |
| 2012/0038400 A1 * | 2/2012 | Talaga, Jr. ..................... 327/156 |
| 2012/0105117 A1 * | 5/2012 | Koh et al. ..................... 327/156 |

* cited by examiner

*Primary Examiner* — Quan Tra
(74) *Attorney, Agent, or Firm* — Abel Law Group, LLP

(57) ABSTRACT

A digital frequency synthesizer provides absolute phase lock and shorter settling time through the use of a digital filter with a phase and frequency path. Control logic control disables the frequency path during the frequency acquisition and sets a wide bandwidth. After frequency acquisition, a counter with digital phase information is reset using the input clock signal to bring the output phase closer to lock with the input signal and the control logic enables the phase path in the digital loop filter to achieve phase lock with a narrower bandwidth than the initial bandwidth.

20 Claims, 3 Drawing Sheets

FREQUENCY SYNTHESIZER WITH HIT-LESS TRANSITIONS BETWEEN FREQUENCY- AND PHASE-LOCKED MODES

BACKGROUND

1. Field of the Invention

This invention relates to digital frequency synthesizers and more particularly to startup conditions associated therewith.

2. Description of the Related Art

Previous digital frequency synthesizers had type-I loop dynamics but did not achieve absolute phase lock. A frequency synthesizer which attempts to phase-lock continuously throughout the settling process takes much longer to lock.

SUMMARY

In order to improve digital frequency synthesizers, embodiments provide a digital frequency synthesizer that provides absolute phase lock and a shorter settling time through the use of a digital filter with a phase and frequency path. Control logic disables the phase path during frequency acquisition and sets a wide initial bandwidth. After frequency acquisition, a counter clocked by the oscillator and sampled by the input clock is reset by a pulse timed to the input clock signal to bring the output phase closer to lock with the phase of the input signal. The control logic also enables the phase path in the digital loop filter to achieve phase lock and causes the digital loop filter to use a narrower bandwidth than the initial bandwidth.

In an embodiment an apparatus to lock an input signal to an oscillator output signal includes a digital loop filter including a frequency path and a phase path, and the phase path is disabled during a portion of a start-up sequence. An oscillator supplies the oscillator output signal. A counter that is coupled to the oscillator and to the digital loop filter, supplies a divided clock signal based on the oscillator output signal.

In another embodiment a method of locking an input clock signal to an oscillator output signal includes generating the oscillator output signal from an oscillator. A digital loop filter generates a digital control word to control the oscillator. A count value is generated in a ripple counter coupled to the oscillator, the count value being based on the oscillator output signal. A digital representation of a phase difference between the input clock signal and the oscillator output signal is generated. The digital control word is adjusted by the digital loop filter according to the count value of the ripple counter and the phase difference.

In another embodiment a method of locking an input clock signal to an oscillator output signal includes generating the oscillator output signal from an oscillator. A digital loop filter supplies a digital control word to control the oscillator. In response to a startup condition, control logic enables a frequency path of the digital loop filter and disables a phase path while achieving frequency lock. After frequency lock, the system transitions from a frequency-locked mode to a phase-locked mode of operation. The transition includes enabling the phase path, resetting a counter supplying information to the digital loop filter, and holding registers in the digital loop filter for at least clock cycle.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
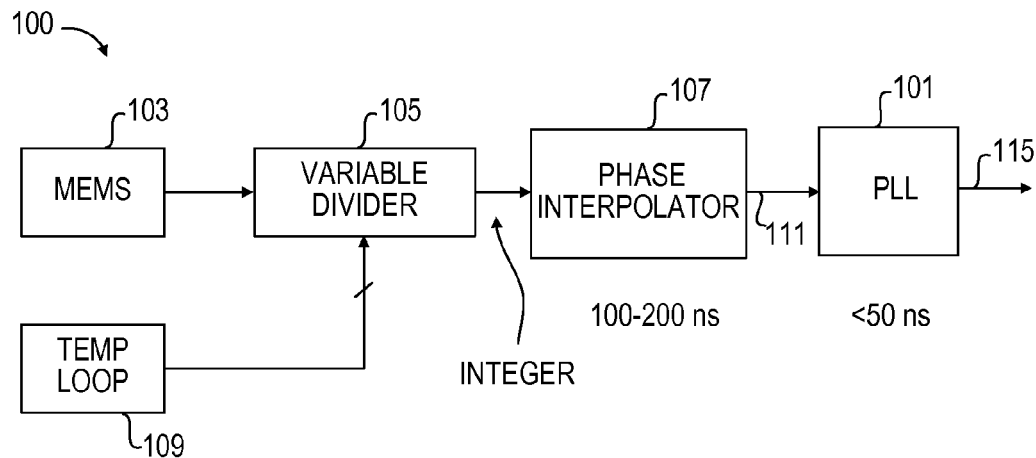
FIG. 1 illustrates a clock synthesizer in which embodiments may be utilized.

Referring to FIG. 1, a frequency synthesizer 100 is illustrated that includes digital phase-locked loop 101. The frequency synthesizer includes a MEMs oscillator 103 that uses an interpolative divider formed by variable divider 105 and phase interpolator 107. A temperature loop 109 that includes a temperature sensor and appropriate temperature compensation adjusts the variable divider divide ratio based on the sensed temperature. The phase locked-loop 101 cleans up (e.g., reduces jitter) the signal supplied by the phase interpolator. In other embodiments, the MEMS oscillator or any other type of oscillator, including an off-chip oscillator, may feed the PLL 101 directly. In the embodiment of FIG. 1, the PLL 101 receives a relatively noisy clock signal 111 as the input clock signal and supplies a cleaner output clock signal 115. Note that other embodiments may omit the interpolative divider and include another PLL or other type of loop instead. Alternatively, the input clock signal to the PLL 101 may come directly or indirectly from another type of oscillator such as a crystal oscillator or any other appropriate oscillator source suitable for the particular implementation.

Figure 2:
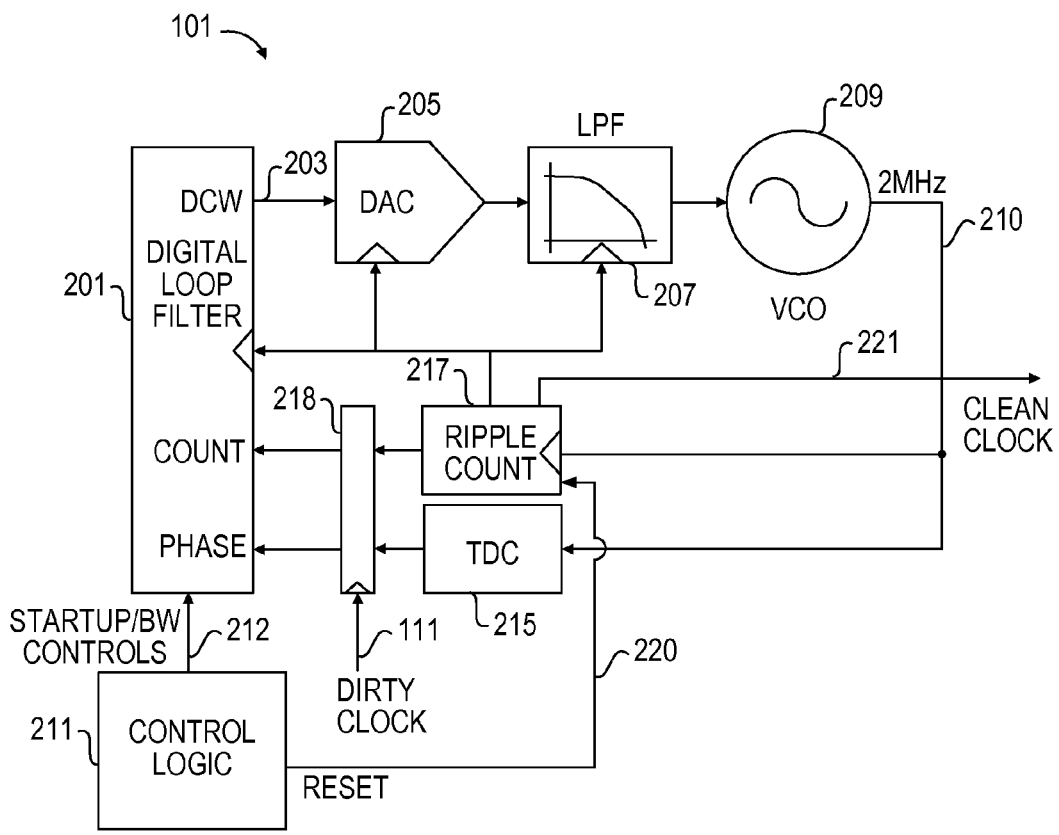
FIG. 2 illustrates an embodiment of a phase-locked loop of the clock synthesizer.

FIG. 2 illustrates the PLL 101 in more detail. The PLL 101 includes a digital loop filter 201 that supplies a digital control word (DCW) 203 to a digital-to-analog converter (DAC) 205. The DAC 205 supplies a low pass filter (LPF) 207 that supplies a control signal to the voltage controlled oscillator 209. Control logic 211, which may be implemented as a finite-state machine (FSM), controls the loop dynamics of the synthesizer during startup. A time-to-digital converter (TDC) 215 quantizes the phase of the voltage-controlled oscillator VCO and in conjunction with sampler 218 provides digital information on the time difference between an edge of the VCO clock signal and an edge of the input clock signal 111. Note that while a VCO is shown, any suitable oscillator may be used. The TDC output is sampled at the loop update rate. The loop update rate in the illustrated embodiment is the frequency of the dirty clock 111 or half that frequency. Other embodiments may use a different update rate, relative to the dirty clock rate. A ripple counter 217 functions as an output clock divider to divide the output of the VCO 209 and supplies a clean output clock 221. The ripple counter 217 also collects frequency information of the VCO 209 output signal 210 in the sense that the value of the ripple counter is dependent on every edge leading up to it. Thus, the counter integrates a history of the VCO output signal 210. For example, assume a ripple counter that can count up to 1024 and a 1 KHz clock input signal to the ripple counter. If the input clock signal is 10 parts per thousand too slow, the counter will be 990, and if the input clock signal is a 10 parts per thousand too fast, the counter value will be 1010.

Note that the phase-locked loop 101 is trying to lock to the input clock 111, which is used to sample the output of the ripple counter 217 and time-to-digital converter 215 in sample storage 218. In an embodiment the output frequency of the VCO 209 is 2 MHz and the output supplied by the clock divider 217 as the "clean clock" 221 is 32 KHz. Thus, the frequency of the clean clock 221 is 1/64 the frequency of the VCO output signal 210. Note that as frequency of the VCO ramps to the desired frequency during startup, e.g., from a power on reset (POR), the ripple counter will be at the wrong phase when the frequency is acquired. If the ripple counter is reset with the input clock 111, the counter can get to 1/64$^{th}$ of the final phase value.

Figure 3:
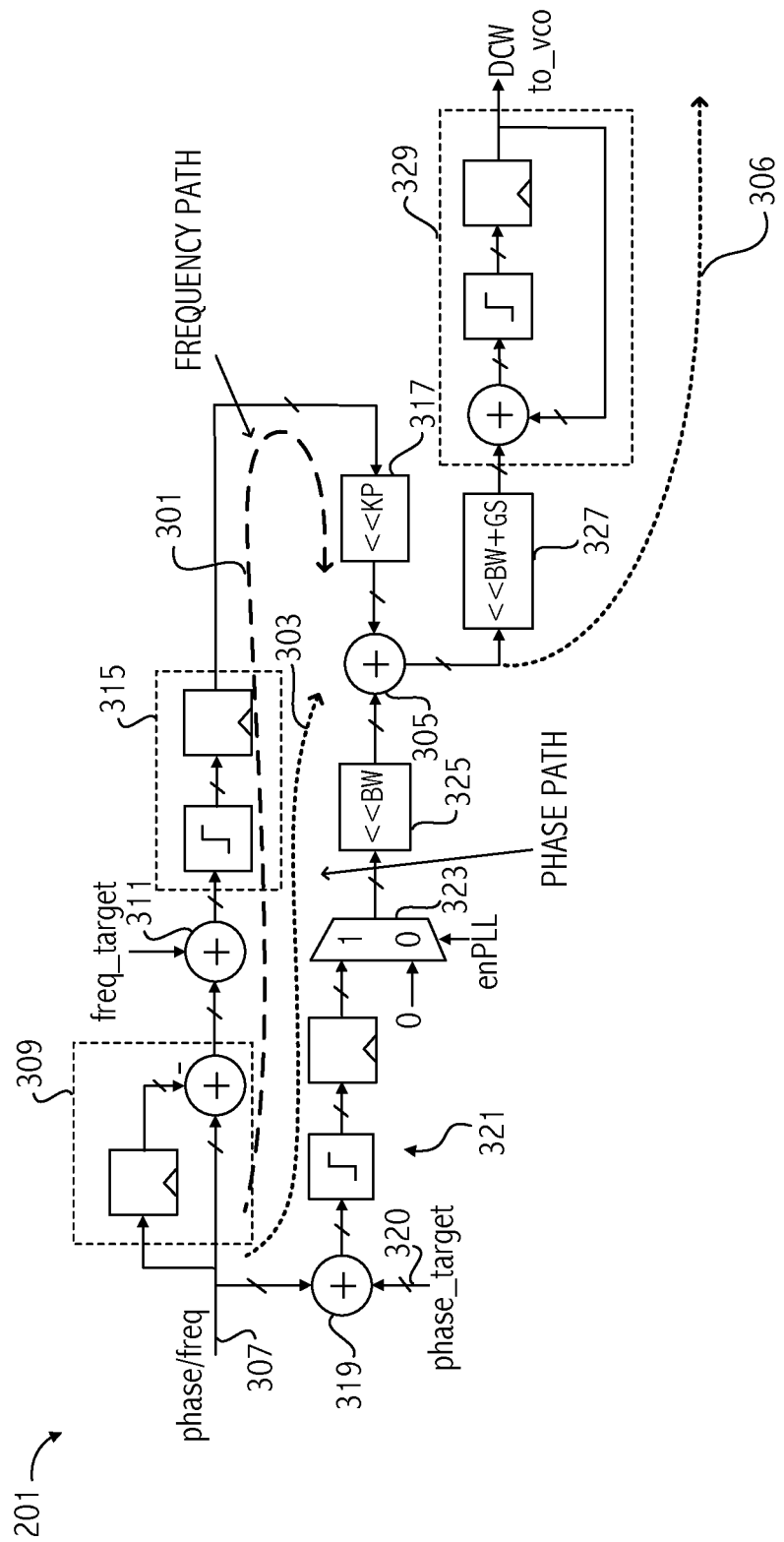
FIG. 3 illustrates a digital loop filter of the phase-locked loop.

FIG. 3 illustrates additional details of the digital loop filter 201. The digital loop filter includes a frequency path 301 and a phase path 303, which combine at summer 305 to form a combined path 306. The digital loop filter receives the sampled ripple counter and TDC combined in FIG. 3 as phase/frequency information 307. In an embodiment the ripple counter is 8 bits and the TDC sample provides 1 bit for a total of 9 bits of phase/frequency information. Other embodiments may use different number of bits for the TDC sample and the ripple counter. During a first portion of startup, the frequency path is active and the phase path is disabled. During a later portion of startup, the phase path is enabled. During startup, the phase/frequency information 307 is differentiated in differentiator 309 to provide a quantized frequency measurement, which is used in a type-I loop to achieve frequency lock. The output of the differentiator 309 is supplied to summer 311 which sums the quantized frequency measurement with a frequency target, e.g., 64. The output of the summer is supplied to saturation register 315. The output of the saturation register is supplied to the gain block 317 that can be used to help control loop stability.

The phase path 303 includes the summer 319 that sums the lower order bits of phase/frequency information 307 with a phase target 320. In an embodiment the phase target is set to 0. In other embodiments, the phase target may be set to one half a clock period to avoid corrections around 0 being perceived as significant errors due to the quantization of the phase. For example, assume the lower order six bits of the phase/frequency information are supplied and a phase error quantized at two occurs. That may be perceived as a count of two or a count of 64+2=66. Thus, targeting the phase error to be in the middle of the low order six bits, e.g., at 32, rather than 0, prevents such discontinuities.

The phase path further includes a saturation register 321, and a multiplexer 323 that supplies phase information or 0 according to the control signal enPLL supplied from control logic 211 (see FIG. 2). Bandwidth logic 325 controls the bandwidth, which may be fixed or programmable according to the needs of the particular embodiment.

The combined path 306 includes gear shift logic 327 to adjust the bandwidth during startup and integrator 329. The output of the integrator 329 is supplied to the DAC 205 as the digital control word 203 (see FIG. 2).

Note that during frequency lock (frequency acquisition), the frequency path includes an integrator 329 and an offsetting differentiator 309. Because this system has a single integrator, a wider stable bandwidth is achievable with a gear-shifting digital loop filter before the parasitic poles in the VCO come into effect. As this system reaches steady-state, there will be a constant phase shift between input and output. At this point, the system transitions from a frequency-locked mode of operation to a phase-locked mode of operation. After frequency lock has been achieved, which may be determined by the passage of a suitable period of time, the control logic 211 (FIG. 2) enables the phase path using the control signal enPLL as part of the transition to a phase-locked mode of operation. The control logic 211 also resets the output clock divider (the ripple counter) using reset signal line 220 (see FIG. 2), forcing a pseudo phase-locked condition between input and output that gets within 1/64$^{th}$ of the final phase value assuming a 32 kHz output clock signal and 2 MHz VCO output signal. Enabling the undifferentiated path (phase path 303) to operate along with the differentiated path (frequency path 301) achieves a proportional integral (P-I) loop filter giving type-II dynamics. That also forces a phase lock between the input clock (dirty clock) and the VCO clock with zero average phase offset.

Figure 4:
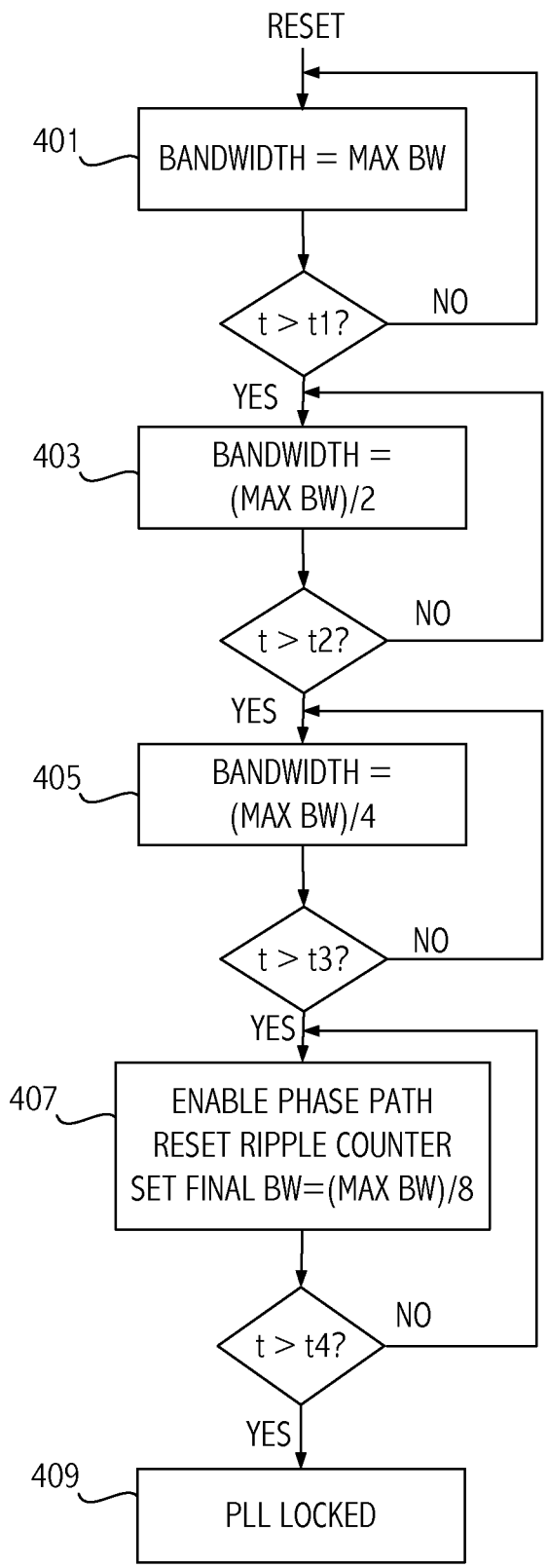
FIG. 4 illustrates a flow diagram of control logic of the phase-locked loop.

FIG. 4 illustrates additional details of an exemplary embodiment of control logic 211. The functions illustrated in the flowchart of FIG. 4 may be implemented in a finite state machine or any other appropriate implementation. As a result of a reset or other appropriate event, the control logic in 401 sets the bandwidth to be the maximum bandwidth and disables the phase path. That can be implemented by providing appropriate control signals to the gear shift logic 327 (FIG. 3) and multiplexer 323 (FIG. 3) through control signals 225 (FIG. 2). After a period of time has elapsed at maximum bandwidth, e.g., t1 seconds, the bandwidth of the loop is reduced to, e.g., half the maximum bandwidth in 403. That level of bandwidth is maintained for t2 seconds, which may be, e.g., twice the length of t1. After the time period t2 has expired, the bandwidth is set to one quarter of the maximum bandwidth for a period of t3 seconds in 405. In an embodiment, t3 is four times the length of t1. Once t3 has expired, the PLL is assumed to have acquired frequency lock. At this time in 407, the control logic enables the phase path 303, resets the ripple counter to align with an edge of the input clock 111, and sets the final bandwidth of the digital loop filter to its final value, e.g., (maximum bandwidth/8). Note that the TDC does not store state information between samples, so there is no need to reset the TDC. At the time that the ripple counter is reset, the registers of the digital loop filter held by preventing them from clocking by gating the clock going to the registers in the digital loop filter, so that one cycle is skipped. Control logic 211 supplies the clock gate signal as part of startup/BW controls 212. Holding the digital loop filter registers for one cycle allows the differentiator in the frequency path to avoid seeing a big discontinuity between samples. Instead, the differentiator differentiates between the reset sample and a subsequent sample, and avoids differentiating between a reset ripple counter value and a ripple counter value prior to reset. Thus, the transition between frequency and phase lock occurs without a "hit" due to a discontinuity in the frequency path. Note that the phase path has been off so will not see such a discontinuity. Because the loop update rate of the digital loop filter (e.g., in an embodiment 32 KHz) is much higher than the final bandwidth of the loop filter, e.g., 100 Hz, missing one sample does not have an appreciable impact on operation of the loop filter. After a period of time t4 has expired, which may be 8 times t1, the control logic sends out a "PLL locked" signal, indicating that the PLL output should be stable.

Thus, a system has been described that achieves phase lock with shorter settling time and transitions from a frequency-locked mode of operation to a phase-locked mode of operation. The description of the invention set forth herein is illustrative, and is not intended to limit the scope of the invention as set forth in the following claims. Other variations and modifications of the embodiments disclosed herein may be made based on the description set forth herein, without departing from the scope of the invention as set forth in the following claims.

What is claimed is:

1. An apparatus to lock an oscillator output signal to an input clock signal comprising:

a digital loop filter including a frequency path and a phase path, wherein the phase path is disabled during a portion of a start-up sequence;

an oscillator supplying the oscillator output signal; and a counter coupled to the oscillator to count transitions of the oscillator output signal and coupled to the digital loop filter, the counter to supply a divided clock signal based on the oscillator output signal.

2. The apparatus as recited in claim 1 further comprising:

a time-to-digital converter circuit, coupled the oscillator output signal and to the digital loop filter, to supply a quantized value of a phase of the oscillator output signal; and a sampler circuit coupled to sample the quantized value according to the input clock signal to provide phase information indicative of a phase difference between the input clock signal and the oscillator output signal to the digital loop filter.

3. The apparatus as recited in claim 2 further comprising:

a differentiator in the frequency path of the digital loop filter and wherein during startup, sampled count values from the counter are combined with the phase information and supplied to the differentiator to provide a quantized frequency measurement used to achieve frequency lock between the input signal and the oscillator output signal.

4. The apparatus as recited in claim 1 wherein the counter is reset as part of a transition from a frequency-locked mode of operation to a phase-locked mode of operation to align the counter with the input clock signal.

5. The apparatus as recited in claim 1 further comprising:

control logic to control the start-up sequence and transition from frequency-locked mode to phase-locked mode of operation.

6. The apparatus as recited in claim 5 wherein the control logic during frequency acquisition is configured to cause the digital loop filter to utilize a first loop bandwidth for a first time period, and a second loop bandwidth, lower than the first loop bandwidth, for a second time period.

7. The apparatus as recited in claim 5 wherein the control logic is configured to enable the phase path of the digital loop filter and to hold registers of the digital loop filter for at least one clock cycle in conjunction with the counter being reset as part of the transition.

8. The apparatus as recited in claim 1 wherein an output signal is supplied from the counter.

9. The apparatus as recited in claim 1 wherein information from the phase path and information from the frequency path are combined on enabling of the phase path to generate a digital control word to control the oscillator.

10. The apparatus as recited in claim 1 wherein the frequency path comprises:

a differentiator coupled to receive phase and frequency information as a differentiator input signal generated by the counter and a time-to-digital converter circuit and to supply a differentiator output signal;

a first summing circuit coupled to receive the differentiator output signal and a frequency target value;

a gain circuit coupled to the first summing circuit;

a second summing circuit coupled to receive a value from the phase path that does not affect the digital control word when the phase path is disabled;

a gear shift circuit to adjust bandwidth; and an integrator coupled to the gear shift circuit to supply the digital control word.

11. The apparatus as recited in claim 10 wherein the phase path comprises:

a third summing circuit coupled to receive low order bits of the differentiator input signal and a phase target value;

the second summing circuit coupled to receive output from the third summing circuit when the phase path is enabled;

the gear shift circuit; and the integrator.

12. A method of locking an oscillator output signal to an input clock signal comprising:

generating the oscillator output signal from an oscillator;

supplying a digital control word to control the oscillator from a digital loop filter;

generating a count value in a ripple counter coupled to the oscillator, the count value being based on the oscillator output signal;

generating a digital representation of a phase difference between the input clock signal and the oscillator output signal;

adjusting the digital control word from the digital loop filter according to the count value of the ripple counter and the phase difference; and disabling a phase path of the digital loop filter while operating a frequency path of the digital loop filter during frequency acquisition.

13. The method as recited in claim 12 further comprising resetting the ripple counter to align the ripple counter to the input clock signal after a predetermined time of frequency acquisition.

14. The method as recited in claim 12 further comprising:

during the frequency acquisition operating the digital loop filter with a first bandwidth for a first time period, and operating the digital loop filter with a second bandwidth lower than the first bandwidth for a second time period during another portion of the frequency acquisition.

15. The method as recited in claim 12 further comprising:

after a predetermined time period, transitioning from a frequency-locked mode of operation to a phase-locked mode of operation, the transitioning including enabling the phase path of the digital loop filter and resetting the ripple counter.

16. The method as recited in claim 15 further comprising blocking clocking registers of the digital loop filter for one or more cycles in conjunction with resetting the ripple counter and turning on the phase path to avoid a discontinuity in the frequency path.

17. The method as recited in claim 14 further comprising combining information from the phase path and information from the frequency path after enabling of the phase path, to generate the digital control word.

18. The method as recited in claim 14 further comprising differentiating information supplied to the frequency path during the frequency acquisition to generate frequency information.

19. A method of locking an oscillator output signal to an input clock signal comprising:

generating the oscillator output signal from an oscillator;

supplying a digital control word to control the oscillator from a digital loop filter;

in response to a startup condition enabling a frequency path of the digital loop filter and disabling a phase path while achieving frequency lock; and transitioning between a frequency-locked mode and a phase-locked mode of operation, the transitioning including enabling the phase path, resetting a counter coupled to the oscillator and the digital loop filter, and holding registers in the digital loop filter for at least clock cycle.

20. The method as recited in claim 19 further comprising:
generating count values in the counter coupled to the oscillator, the count value being based on the oscillator output signal;
generating digital phase information corresponding to a phase difference between the input clock signal and the oscillator output signal; and
supplying the count values and the phase information to the digital loop filter.

\* \* \* \* \*

UNITED STATES PATENT AND TRADEMARK OFFICE
CERTIFICATE OF CORRECTION

PATENT NO. : 8,786,341 B1
APPLICATION NO. : 13/833360
DATED : July 22, 2014
INVENTOR(S) : Weltin et al.

It is certified that error appears in the above-identified patent and that said Letters Patent is hereby corrected as shown below:

In the Claims

Column 5, line 10, claim 2, please insert --to-- after "coupled";

Column 6, line 67, claim 19, please insert --a-- before "clock".

Signed and Sealed this
Twenty-first Day of October, 2014

Michelle K. Lee
*Deputy Director of the United States Patent and Trademark Office*